United States Patent [19]
Proebsting

[11] Patent Number: 5,926,050
[45] Date of Patent: Jul. 20, 1999

[54] SEPARATE SET/RESET PATHS FOR TIME CRITICAL SIGNALS

[75] Inventor: Robert J. Proebsting, Los Altos Hill, Calif.

[73] Assignee: Townsend and Townsend and Crew LLP, San Francisco, Calif.

[21] Appl. No.: 08/885,145

[22] Filed: Jun. 30, 1997

Related U.S. Application Data

[60] Provisional application No. 60/023,294, Jul. 29, 1996.

[51] Int. Cl.[6] ........................................... H03K 5/12
[52] U.S. Cl. ........................ 327/170; 326/17; 326/82; 327/109
[58] Field of Search ................... 326/17, 20, 29, 326/35, 36, 82, 83; 327/108, 109, 170, 374

[56] References Cited

U.S. PATENT DOCUMENTS

| | | | |
|---|---|---|---|
| 4,599,528 | 7/1986 | Redfield | 307/443 |
| 4,670,672 | 6/1987 | Ando et al. | 326/29 |
| 4,985,643 | 1/1991 | Proebsting | 326/17 |
| 5,061,864 | 10/1991 | Rogers | 307/443 |
| 5,149,990 | 9/1992 | Yamazaki et al. | 326/83 |
| 5,247,212 | 9/1993 | Vinal | 307/448 |
| 5,274,277 | 12/1993 | Chan | 307/443 |
| 5,430,399 | 7/1995 | Wendell | 326/121 |
| 5,519,344 | 5/1996 | Proebsting | 327/108 |

FOREIGN PATENT DOCUMENTS

| | | | |
|---|---|---|---|
| 0348998 | 6/1989 | WIPO | 27/88 |

OTHER PUBLICATIONS

Horowitz et al., "The Art of Electronics," Cambridge University Press, 1980, Cambridge, GB p. 376.

Primary Examiner—Timothy P. Callahan
Assistant Examiner—Jeffrey Zweizig
Attorney, Agent, or Firm—Townsend and Townsend and Crew LLP

[57] ABSTRACT

A digital system includes apparatus for propagating falling and rising edges of a digital signal through two separate data paths each optimized to maximize propagation of one edge of the signal. The first data path is structured to propagate the first transition (e.g., falling edge) of the digital signal with a delay less than that experienced by the second transition (rising edge); and the second data path is structured to propagate the second transition with much less delay than that experienced by the first data transitions. The outputs of the two data paths are applied to a combining circuit, and put together to form a final representation of the digital signal to use the first and second state transitions as propagated by the apparatus.

18 Claims, 3 Drawing Sheets

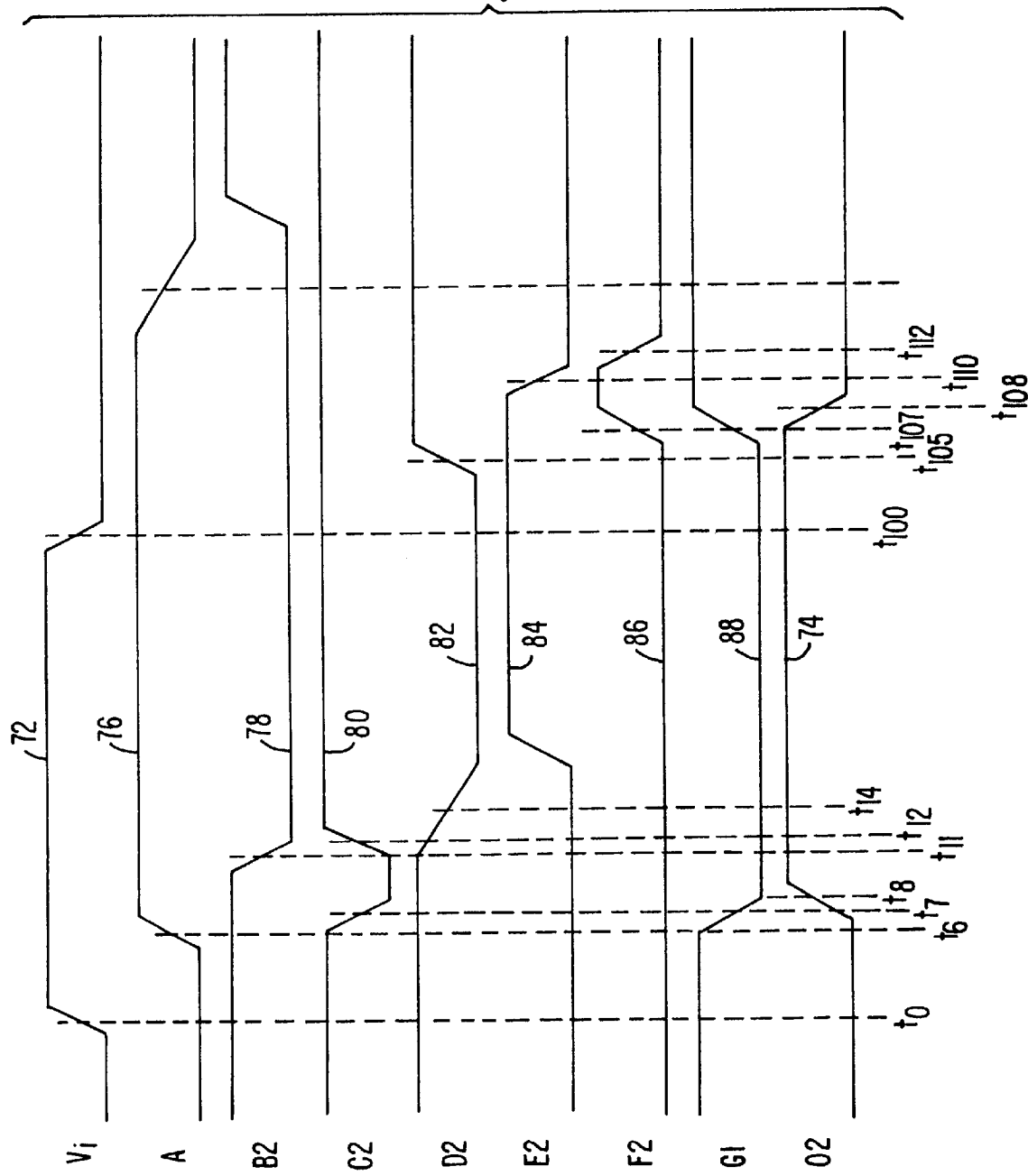

SEPARATE SET/RESET PATHS FOR TIME CRITICAL SIGNALS

This application claims the benefit of U.S. Provisional Application No. 60/023,294, Jul. 29, 1996.

BACKGROUND OF THE INVENTION

The present invention is directed generally to digital apparatus, and more particularly to apparatus for communicating the state transitions of a periodic digital signal from one circuit node to another circuit node with a minimum of delay.

Much of today's digital electronics is implemented in large scale integration (LSI) dominated by a logic family called complementary MOS (CMOS). The basic structure of CMOS logic is the CMOS inverter in which an upper PMOS transistor is connected to a lower NMOS transistor in a type of push-pull configuration. The advantage of this configuration is that little current is conducted when the inverter is in one of its non-switching states: when the input signal is a logic low level (e.g., ground or a negative voltage) the bottom NMOS transistor is off while the top (PMOS) transistor pulls the output toward a supply voltage; when the input receives a logic high level input the transistors reverses their states. In addition to less power consumption than other logic families (e.g., transistor-transistor-logic), CMOS can provide such additional advantages as generating less heat, and requiring less semiconductor space, permitting an integrated circuit to be more densely packed.

However, a severe limitation of MOS circuits is the various capacitances inherent in MOS structures which affects switching speeds and, thereby, speed of operation. Limiting the size of MOS transistors will, in turn, limit the inherent capacitances, but this limits the current provided by the transistors to drive the capacitance of the next stage. There are times when large capacitances (e.g., in the form of a number of MOS logic gates) must be driven by an MOS developed signal, necessitating larger CMOS transistors. In such cases the resultant delay can be minimized by using a series of cascaded CMOS inverters ("buffering up" as it is sometimes called in this art) to convey the driving signal, each inverter being larger in size than the one before it until the last stage is reached with the structure necessary to drive the capacitance with a minimum of delay.

The speed of an MOS transistor is related to its size, i.e., the width and length of the channels of the MOS transistors. It is generally standard practice in this art to fabricate MOS transistors (both PMOS and NMOS transistor structures) with a channel length that is the minimum allowed by the manufacturing technology employed, since this maximizes the current the transistor can provide while minimizing the capacitance of the transistor. Accordingly, discussion of the size of a transistor herein, unless otherwise noted, shall refer to the size of the channel width of the transistor in question.

Returning to the CMOS inverter structure, the speed with which the PMOS and NMOS transistors of a CMOS inverter can respectively pull the output node toward one voltage or another, i.e, the delay of the inverter, is directly related to the size of the driving transistor, and to the size of the transistor (s) that is being driven. This relationship, often termed "fanout," is the ratio of the size (i.e., channel width) of the driven transistor or transistors to that of the driving transistor.

The signals of concern herein are periodic digital pulses having positive and negative-going state transitions. MOS circuits are usually designed to transmit both transitions with substantially equal delay from one circuit node to another. Such designs tend to exhibit a moderately long delay in the transmission of both transitions.

It is believed known to enhance the size of one or the other of the transistors of a CMOS pair so that it is capable of switching faster on one transition of an applied input signal than the other, thereby communicating that one transition with less delay than the other. Thus, a series of such CMOS stages can be formed to pass one transition of a signal with less delay than the other transition, and more specifically, with less delay than that of an inverter designed to transmit both transitions with substantially the same delay. The problem with this approach, however, is that the delayed transition arrives much later than desired.

BRIEF DESCRIPTION OF THE INVENTION

The present invention is directed to communicating the transmission of both the rising and falling transitions of a periodic signal from one circuit node to another with a minimum of delay.

Broadly, the invention comprises a pair of data paths formed between the two circuit nodes, each data path being optimized to pass a corresponding one of the state transitions (i.e., positive-going and negative-going) of the periodic signal. Thus, one of the data paths will be structured to communicate the positive going state transition of the signal from a first circuit node to a second with less delay than experienced by the negative-going transition. The other data path is similarly structured, except that it is optimized to communicate the signal's negative-going transition to the second circuit node with a delay less than that presented to the positive transition.

In one embodiment of the invention the two data paths are each formed by a cascaded series of CMOS inverters, each inverter including a pair of MOS (one PMOS and one NMOS) transistors. The one data path is optimized to communicate a first (e.g., positive-going) transition of the digital signal faster than a second transition of the signal. This is achieved by sizing the PMOS or NMOS transistor of each CMOS inverter stage responsible for driving the first transition to the succeeding stage to be larger than the transistor responsible for driving the second transition, to increase the current this transistor can provide. At the same time the other transistor of each CMOS inverter is made smaller so that this smaller transistor presents a relatively smaller capacitive load to the preceding driving inverter.

However, although the larger size of the one transistor and the reduced size of the other of each of the CMOS cascaded inverters will optimize the cascaded CMOS inverters to pass the first (e.g., positive-going) transition of the data signal with a predetermined minimum of delay, it is at the expense of the second (e.g., negative-going) transition, which sees a relatively much greater delay. Thus, the other of the two data paths is designed in the same fashion as the first, except that it is optimized to transmit the second transition with much less delay than the first, in the same manner as the first data path.

In another embodiment of the invention, separate data paths for two different signals are optimized in the manner described to ensure that one signal will arrive to condition a circuit before the other; and that the second transition of the second signal to arrive before that of the first signal.

In a further embodiment of the invention, a pair of data paths are formed from cascaded strings of CMOS inverters, as described above, and logically combined to produce a circuit capable of delivering a signal from one circuit node to a second node in a buffered condition to drive a high capacitive load.

A number of advantages are presented by the present invention. First, a digital signal containing first and second state transitions used, for example, to set and reset certain logic circuitry can be communicated with less delay using separate data paths for each transition. Much faster CMOS circuitry can result therefrom.

It will be appreciated that although the invention is illustrated and described in terms of two data paths formed from cascaded CMOS inverters, it need not be so limited. Most CMOS logic circuits have, as an output stage, a CMOS inverter. Thus, the concepts of the invention can be applied to any CMOS circuit configuration having signalling containing positive and negative transitions that are, in effect, communicated from one point to another through CMOS implemented logic, including, for example, inverters, NAND gates, NOR gates, etc. Address decode circuitry is just one example of the use of the present invention to enhance, and reduce the delay of, a final decode from an address presented in true complement form. It will be evident, therefore, that from this flows the advantages that virtually any CMOS logic can be enhanced to operate with less delay by using the redundancy of two optimized data paths for communicating the necessary transitions of one or more periodic signals.

These and other advantages and aspects of the present invention will become apparent to those skilled in the art upon a reading of the following detailed description of the invention, which should be taken in conjunction with the accompanying drawings.

BRIEF DESCRIPTION OF THE DRAWINGS

FIG. 5 is a timing diagram that illustrates the operation of the circuit of FIG. 4.

DETAILED DESCRIPTION OF THE INVENTION

Figure 1:
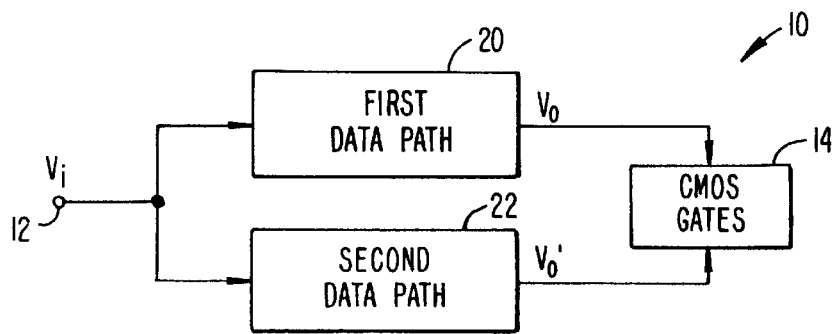
FIG. 1 is a block diagram illustration of the present invention.

Turning now to the figures, and for the moment specifically FIG. 1, there is illustrated in block diagram form a CMOS circuit constructed according to the teachings of the present invention, designated generally with the reference numeral 10. The CMOS circuit 10 operates to communicate a periodic pulse signal provided at a first circuit node 12 as an input signal $V_i$ to a second circuit node 14 which may be, as illustrated, a capacitive load in the form of a number of MOS gates.

The CMOS circuit 10 receives the input signal $V_i$ for communication to the circuit node 14 by first and second data paths 20, 22, the outputs of which provide the transmitted signal to the circuit node 14 as output signals $V_o$ and $V_o'$. In accordance with the present invention, and as will be described more fully below, each of the data paths 20, 22 is optimized to convey one or the other of the two state transitions (i.e., positive-going and negative-going) contained in the input signal $V_i$ with a minimum of delay to the circuit node 14, and at the same time buffering the signal so that it can effectively drive the capacitive load presented to it by the CMOS gates at the circuit node 14.

Figure 2:
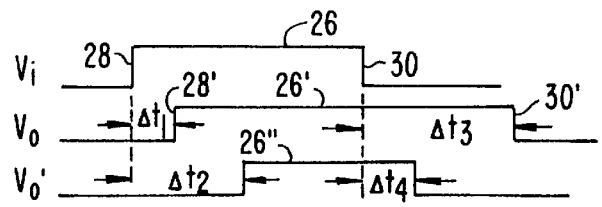
FIG. 2 is a timing diagram that illustrates operation of the block diagram of FIG. 1.

FIG. 2 represents the various wave forms involved in the operation of the system 10. The input signal $V_i$ is shown as the wave form 26, having first and second state transitions 28, 30. The outputs of the pair of data paths, 20, 22 are shown in FIG. 2 as the waveforms 26' and 26", respectively. The first data path 20, optimized for the communication of the positive-going transition 28 of the input signal $V_i$, conducts the signal to the circuit node 14 with a minimized delay $\Delta t_1$. Similarly, the second data path 22, optimized to communicate the second, negative going transition, conveys the second transition of the input signal $V_1$ to the circuit node 14 with the minimized delay $\Delta t_4$.

There is a price to be paid, however. For reasons that will become clearer below, optimizing a series string of CMOS inverters to minimize the delay to communicate one transition of the input signal $V_i$ will increase the delay experienced by the other transition. Thus, as FIG. 2 shows, optimization of the first data path 20 for the positive-going transition 28 causes the second, negative-going transition of the input signal $V_i$ to be communicated to the circuit node 14 with a large delay $\Delta t_3$. And, in similar fashion, the second data path 22 is similarly hostile to the first, positive-going transition 28, communicating it with the delay $\Delta t_2$.

Figure 3:
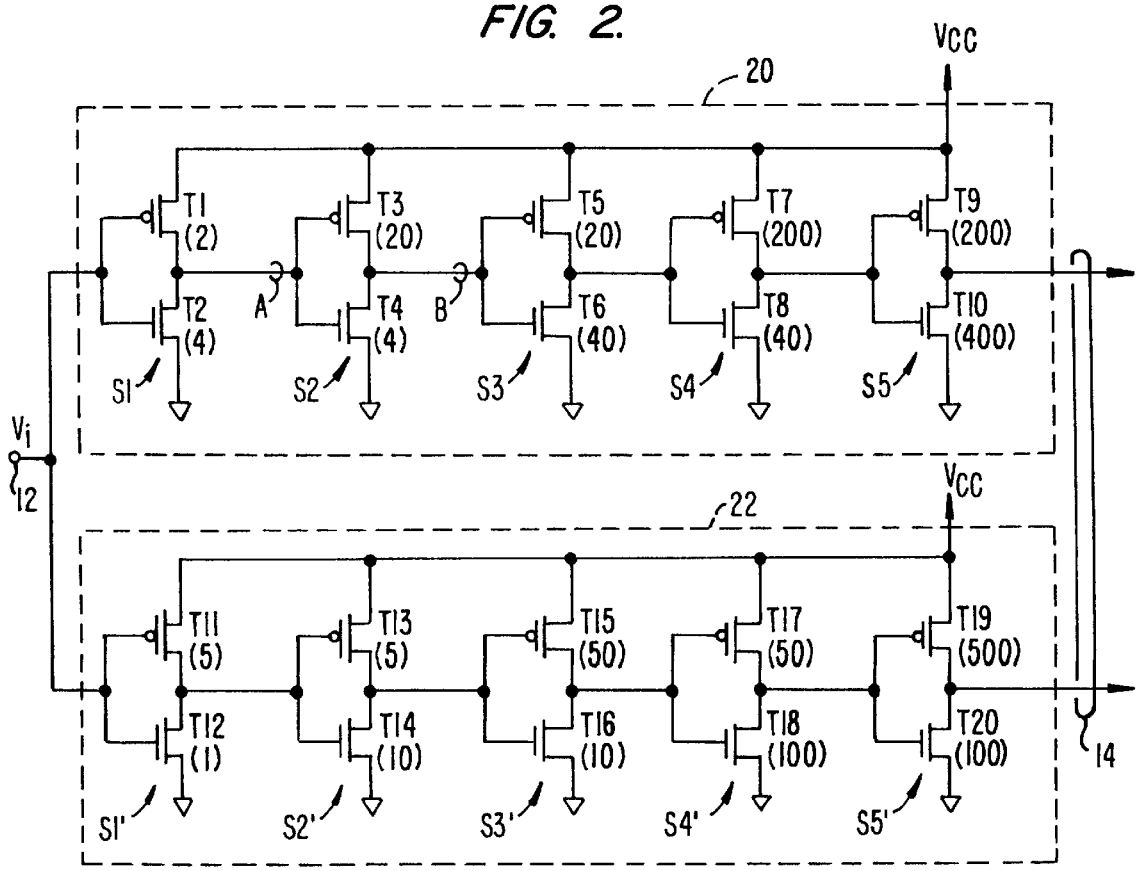
FIG. 3 is an circuit implementation of the invention shown in FIG. 1 in the form of a pair of data paths each having a series string of CMOS inverters constructed according to the teachings of the present invention.

Turning now to FIG. 3, the circuitry used to implement the data paths 20, 22 of FIG. 1 is shown in schematic form. As FIG. 3 illustrates, each of the data paths, 20, 22, comprises a plurality of cascaded CMOS inverters. The data path 20 includes inverters $S_1, \ldots, S_5$ and the second data path 22 includes the inverters $S'_1 \ldots, S'_5$.

It will be evident to those skilled in the art that although this discussion of the construction and optimization of the data paths 20, 22 is in terms of a number of CMOS inverter stages, the stages could just as easily be a chain of logic elements functions such as, for example, NAND gates or NOR gates. For example, at the very least, it is not uncommon for the output of MOS-implemented logic function circuits to use a CMOS output stage, and that a sub-system constructed of such logic function circuits will, in effect, include a number of cascaded CMOS inverters. Thus, description of the first and second data paths illustrated in FIG. 3 should not be taken as being limited only to the series string of CMOS inverters illustrated in FIG. 3.

Returning to FIG. 3, each of the CMOS inverters S1 . . . , S5 and S1' , . . . , S5' is includes a PMOS transistor to pull its output to the positive supply Vcc (e.g., 5 volts), and an NMOS transistor to pull the output to a lower supply Vss (e.g., ground). The common gate terminals of the transistors of each CMOS inverter forms the input of that inverter to receive the signal from the preceding inverter, while the common drain terminals of the PMOS and NMOS transistors in each inverter form the output node of the inverter that connects to the input of the next succeeding inverter.

Thus, for example, the input stage CMOS inverter S1, comprises the PMOS transistor T1 and NMOS transistor T2 interconnected as described. The gate terminals of the transistors T1 and T2 receive the input signal $V_i$, and the output node A is taken from their drain terminals.

As indicted above, the data path 20 is designed to optimize propagation of the positive-going transition of the signal $V_i$ presented to the node 12. This is accomplished, as also indicated above, by optimizing the size of the transistor responsible for conveying the rising transition to the next succeeding CMOS inverter. At the same time, the size of the other companion transistor of each CMOS pair is kept relatively small in order to keep the capacitance presented to the preceding stage low and to provide little opposition to the large transistor during the transition of the input. In FIG. 3 exemplary sizes for the transistors of each CMOS inverter are shown in the parentheses next to the transistor. In this example, each NMOS transistor in the fast path is driving a total gate width (PMOS+NMOS) of the next stage six times that of the driving transistor. Each PMOS in the fast path drives a total gate width three times that of the driving transistor. The actual transistor sizes will depend upon the particular implementation, so that FIG. 3 is illustrative only. Thus, for example, the CMOS inverter S1 has a PMOS transistor T1 2 microns in size (i.e., channel width) while the companion NMOS transistor T2 in the fast path is 4 microns in size. Since it is the NMOS transistor T2 that is responsible for driving the received positive-going transition (as a negative-going transition at node A) to the next inverter S2, it is the larger transistor. Note also that the fanout (i.e., the ratio of the driven transistors, the PMOS transistor T3 and the NMOS transistor T4, to the driving transistor, NMOS transistor T2) is 6. In the following stage, the fast negative transition at node A turns on relatively large PMOS transistor T3 to quickly pull node B high. PMOS transistor T3 is 20 microns wide and drives the capacitance of transistors totaling 60 microns and therefore has a fanout of only 3.

The transistors of succeeding CMOS inverters stages, S3, S4 and S5 are structured in a similar fashion. The NMOS transistor T6 of the stage S3 is enlarged, and its companion PMOS transistor T5 is made smaller, while PMOS transistor T7 of stage 4 is enlarged while its companion NMOS transistor T8 is made smaller.

The transistors of the second data path 22 are similarly structured, except that the driving transistors of the stages S1' , . . . , S5' are reversed because it is the second, or negative-going transition 30 of the input signal $V_i$ for which the data path is optimized. Thus, the sizes of the transistors T11, T14, T15, T18, and T19 of the CMOS inverters S1' , . . . , S5' are larger than their companions.

The number of inverters in a series string depends upon such parameters as the capacitance of the load at the circuit node 14 (FIG. 1). Thus, the number of inverters S1, . . . , S5, S1' , . . . , S5' can be increased or decreased, to match the delay and load of the particular situation. Also as is generally known in this art, a PMOS transistor is about one-half as conductive as an NMOS transistor of the same size. Thus, it would have a delay about twice that of the NMOS transistor if it had the same fanout as the NMOS. To keep the delay of the PMOS transistors low, the very low PMOS fanout of 3 is chosen.

Construction of the data paths 20, 22 must also consider the penalty: the other transition for which the path is not optimized. This transition will be propagated through the data paths 20, 22 by the smaller transistors of each CMOS inverter with a much greater delay, and if the delay is too great it may adversely affect operation of the load at the circuit node 14. It will also be seen that the input signal $V_i$ must also have certain constraints in that it must be somewhat well-behaved.

The present invention has thus far been described in terms of providing two separate data paths to deliver transitions of an aperiodic signal to a circuit node with undue haste. However, it can also be used to ensure that one signal arrives at a circuit node for performing an operation before arrival of another different signal, or to hasten termination of a one signal before another for synchronized operation. An example of one such circuit can be found in word line selection circuits used in dynamic random access memories (DRAMs) implemented with CMOS technology. In a DRAM word line selection circuit, there exists a word line driver transistor whose gate potential is boosted to a voltage level higher than the supply voltage. For proper operation of the word line driver circuit, it is imperative that the decoded address pulls the gate terminal of the driver transistor high before the drain terminal of the driver transistor is pulled high to accomplish the bootstrapping. The technique of the present invention can be used to meet this timing constraint of the DRAM word line selection circuit.

Figure 4:
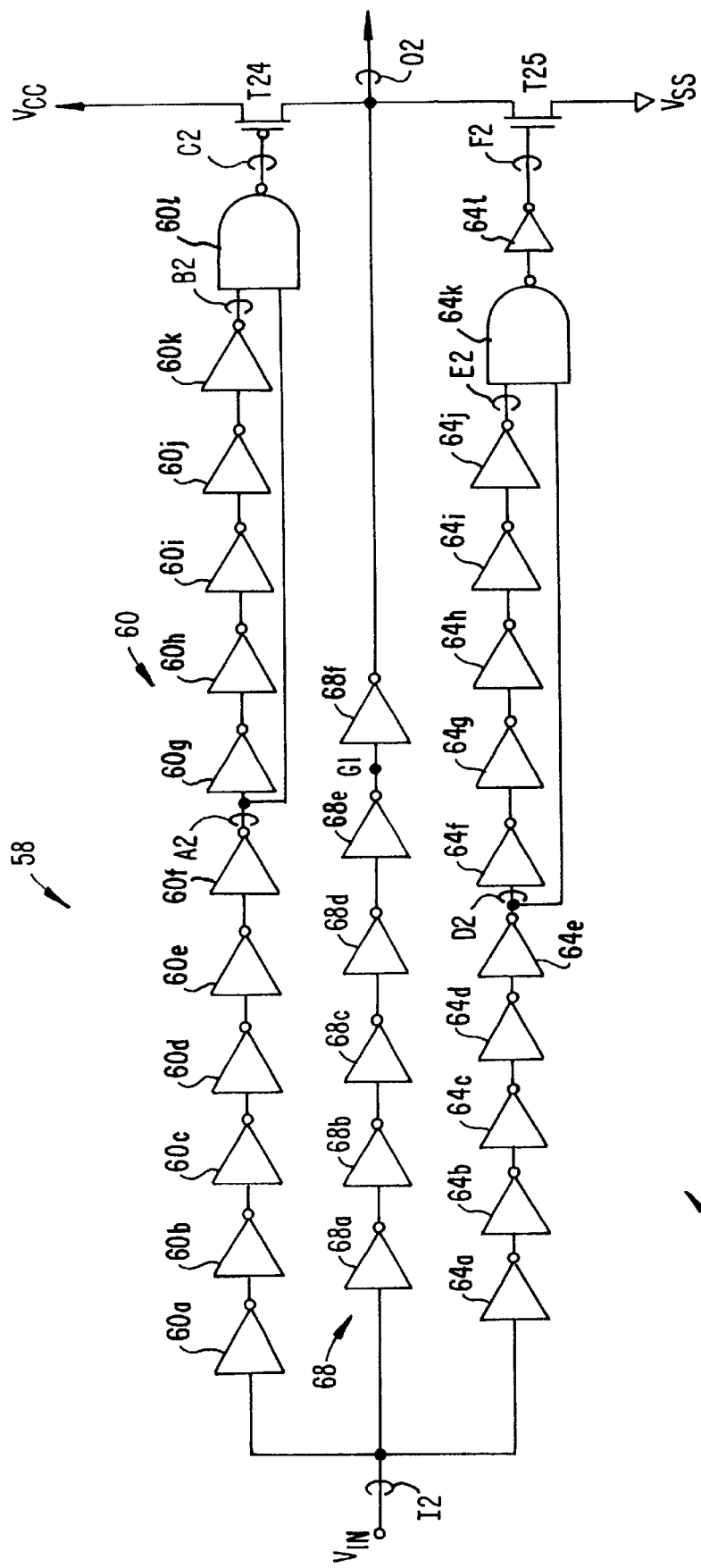
FIG. 4 is a circuit diagram illustrating a logical combination of two separate signal paths constructed according to the teachings of the present invention for communicating a pulse to drive a high capacitive load.

Turning now to FIG. 4, there is illustrated a representative circuit 58 that logically combines two data paths used to propagate the two transitions of a periodic signal, buffering-up the signal so that it can drive a large capacitive load (not shown). FIG. 4 shows two data paths 60 and 64 each respectively formed from a cascaded series of CMOS inverters 60a, . . . , 60k (including the NAND gate 60l, and the PMOS transistor T24) and 64a, . . . , 64j (including NAND gate 64k, CMOS inverter 64l, and NMOS transistor T25). A third data path 68, comprising CMOS inverters 68a, . . . , 68f operates, as will become clear below, to hold the output O2 in a high or low quiescent state.

The data path 60 is designed to propagate, from the input node I2, the positive-going transition of the input signal $V_i$ to the output node O2. Thus, the CMOS inverters 60a through 60f in the data path 60, and the CMOS NAND gate 60l, are designed so that the one transistor of the CMOS pairs that is responsible for driving the transition in question to the next state is enlarged, while its companion is reduced in size (within the constraints of the resultant longer delay that can be tolerated in transmitting the second transition through data path 60). The first five stages of data path 60 may, for example, be the five stages in path 20 of FIG. 3.

The data path 64 (including the CMOS NAND gate 64k and inverter 64l) is similarly designed, except that it optimizes propagation of the negative-going transition of the input signal $V_i$ from the input node 12 to the output node O2. The first five stages of data path 64 may, for example, be the five stages in path 22 of FIG. 3.

As FIG. 4 shows, the node A2 at the output of the CMOS inverter 60f of the data path 60 is coupled to one of the two inputs of the NAND gate 60l; the other input receives the output of the CMOS inverter 60k. Similarly, the output of the CMOS inverter 64e forms a node D2 that connects to one input of the NAND gate 64k, the other input receiving the output of the inverter 64j. The output of the circuit of FIG. 4 is formed by a CMOS pair of transistors, PMOS transistor T24 and NMOS transistor T25 respectively connected to the supply voltages Vcc and Vss.

FIG. 5 is a timing diagram that illustrates operation of the circuit 58. The input signal $V_i$ is shown as waveform 72, and the resultant output (at node O2) is illustrated as waveform 74. Assuming the input signal $V_i$ has been low for some time, node A2 will be low, driving the output of NAND 60l (node C2) high, so PMOS transistor is off. Also, node E2 is low, the output of NAND gate 64K is high, node F2 is low, and NMOS transistor T25 is also off. The output node O2 will be held low by the data path 68, since node G1 is high. The CMOS inverters 68a, . . . , 68f of the data path 68 are of conventional design, have equal delays for rising and falling transitions, and are designed to have a delay about equal to the fast delay in the other paths. The function of data path 68 is not, as is the remainder of the circuit 58, to drive a large capacitive load. Rather, the data path 68 is constructed with just enough delay to propagate the input signal $V_i$ to the output node O2 just as the output switches in order to hold the output in one of the two states it will assume. To achieve the proper delay, six stages are used compared to eight stages in paths 60 and 64, and each stage has less fanout than those in paths 60 or 64. Thus, the transistors in inverter 68f are much smaller than T24 or T25.

Considering first the data path 60 and referring to both FIGS. 4 and 5, at time $t_0$ the input signal $V_i$ undergoes a positive-going transition. With a (fast) six inverter (60a, 60b, 60c, 60d, 60e, and 60f) delays thereafter at time $t_6$, node A2 follows with a positive-going transition as shown by the waveform 76. Note the time designation $t_6$ corresponds to 6 fast inverter delays after $t_0$. Node B2 which is a delayed inverse of node A2 does not switch to a low level until five inverter (60g, 60h, 60i, 60j, and 60k) delays later at time $t_{11}$, as shown by waveform 78. Thus, both inputs to the NAND gate 60l are high from time $t_6$ to time $t_{11}$, and its output, node C2 goes low from time $t_7$ to time $t_{12}$ as shown by waveform 80. When node C2 goes low, the PMOS transistor T24 turns on pulling the output node O2 toward the supply voltage Vcc at time $t_8$ as shown by waveform 74.

When node C2 goes back high at time $t_{12}$, PMOS transistor T24 turns off in preparation for the next negative transition of the input. It is the data path 68 that maintains the high level at node O2 after time $t_{12}$. Since the path 68 does not drive a large capacitive load, normal sized and relatively low fanout inverters 68a, 68b, 68c, 68d, and 68e are designed to generate a falling edge at node G1 at about the same time as the falling edge of the signal at node C2 (i.e., at time $t_7$). Thus, inverter 68f maintains output node O2 at a high level after it is driven high by large PMOS transistor T24 with a little help from relatively small inverter 68f.

Turning to path 64, the inverters 64a, 64b, 64c, 64d and 64e are slower in propagating the rising edge of $V_i$. As shown by waveform 82 in FIG. 5, the signal at node D2 does not make a falling transition until time $t_{14}$, well after time $t_7$. The falling transition on node D2 precedes the rising transition on node E2. As a result, node F2 remains low keeping NMOS transistor T25 turned off. With NMOS T25 remaining off, it cannot interfere with the early pull-up of the output by PMOS transistor P24 even though node D2 has not yet responded to the rising transition of the input.

The higher speed of data path 64 is realized when the input signal $V_i$ makes a negative going transition at time $t_{100}$. This falling edge propagates through the CMOS inverters 64a–64e of the second data path 64 to node D2 at time $t_{105}$ (waveform 82), and is applied to one input of the NAND gate 64k. Node E2 does not fall until five inverter (64f through 64j) delays after node D2 rises at time $t_{110}$ (waveform 84). Thus, for the time window between time $t_{105}$ and time $t_{110}$, both inputs to the NAND gate 64k are high causing its output to be low between $t_{106}$ and $t_{111}$. Node F2 will be high between times $t_{107}$ and $t_{112}$. This turns on the NMOS transistor T25 pulling the output node O2 toward Vss at time $t_{108}$. During this time PMOS transistor T24 is off. (Node C2 is high.) The NMOS transistor T25 is turned off and stops driving node O2 low at time $t_{112}$ after node F2 drops low, in preparation for the next positive transition of the input. From this time on, the output node O2 is held in the low state by the data path 68, until the next (positive-going) transition of the input signal $V_i$, which starts the cycle over again. Note that the output is driven low long before node A2 switches low. That is, the slow path of node A2 does not interfere with the fast path of D2.

In conclusion, the present invention offers method and circuitry for increasing the speed of signal propagation in CMOS logic circuits. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. Apparatus for propagating a digital signal of the type having first state transitions from a first digital state to a second digital state, and second state transitions the second digital state to the first digital state, the apparatus comprising:

a first data path having an input coupled to receive the digital signal, output, the first data path being optimized to propagate the first state transitions from the input to the output with much less delay than the second state transitions;

a second data path having an input coupled to receive the digital signal, an output, the second data path being optimized to propagate the second state transitions from the second data path input to the second data path output with much less delay than the first state transitions;

a combine circuit coupled to the first data path and the second data path outputs to logically combine the digital signal propagated by the first and the second data paths; and a third data path having an input coupled to receive the digital signal and an output coupled to an output of said combine circuit, the third data path propagating the first stage transitions and the second state transitions with substantially equal delay.

2. The apparatus of claim 1, wherein the first and second data paths are each formed from a plurality of serially coupled CMOS inverter stages.

3. The apparatus of claim 2, wherein alternating ones of the CMOS inverter stages of the first data path are configured to pass the first state transition with less delay than that of the second state transitions, the other of the CMOS inverters being configured to pass the second state transitions with less delay than the first state transitions.

4. The apparatus of claim 3, wherein alternating ones of the CMOS inverters of the second data path are optimized to pass the second state transition with less delay than the first state transitions, the other of the CMOS inverter stages of the second data path being optimized to pass the first transition with less delay than the second state transition.

5. Apparatus for propagating a digital signal to a digital means for initiating and terminating an event, having first transitions between two states to initiate the event, and second transitions for terminating the event, the apparatus comprising:

a first data path having an input coupled to receive the digital signal and an output coupled to the digital means, the first data path being formed from CMOS circuitry optimized to propagate the first transitions from the input of the first data path to the output with a delay less than the delay of the second transitions;

a second data path having an input coupled to receive the digital signal and an output coupled to the digital means, the second data path being formed from CMOS circuitry optimized to propagate the second transitions from the input of the second data path to the output of the second data path faster than the first transitions; and a combine circuit having a first one-shot circuit coupled to the output of the first data path and a second one-shot circuit coupled to the output of the second data path.

6. The apparatus of claim 5, wherein the CMOS circuitry of the first and second data paths include a number of individual, cascaded CMOS circuits.

7. The apparatus of claim 6, wherein the number of individual, cascaded CMOS circuits included in the first data path each include a PMOS transistor and an NMOS transistor coupled to form a series current path, and alternating ones of the CMOS circuits having the corresponding NMOS transistor structured to propagate the first transition with less delay than the corresponding PMOS transistor propagates the second transition.

8. The apparatus of claim 7, wherein the PMOS transistor of each of the other of the number of CMOS circuits included in the first data path is structured to propagate the first transition with less delay than the corresponding NMOS transistor propagates the second transition.

9. The apparatus of claim 7, wherein NMOS transistor of each of the alternating ones of cascaded CMOS circuits is fabricated to have a fan-out greater than that of the corresponding PMOS transistor.

10. The apparatus of claim 9, wherein the PMOS transistor of each of the other of the number of CMOS circuits is structured to have a fan-out greater than the corresponding NMOS transistor.

11. The apparatus of claim 6, wherein the number of individual, cascaded CMOS circuits included in the first and second data paths each include a PMOS transistor and an NMOS transistor intercoupled to receive the digital signal propagated by the first and second data paths and to form a series current path between a first voltage and a second, lower voltage, alternating ones of the CMOS circuits of the first data path having the corresponding NMOS transistor structured to propagate the first transition with less delay than the corresponding intercoupled PMOS transistor propagates the second transition, and alternating ones of the CMOS transistors of the second data path having the corresponding PMOS transistor structured to propagate the second transition with less delay than the intercoupled NMOS transistor propagates the first transition.

12. The apparatus of claim 11, wherein NMOS transistors of the alternating ones of the CMOS circuits of the first data path, and the PMOS transistors of the alternating ones of CMOS circuits of the second data path are structured to have a fan-out less than that of the intercoupled PMOS and NMOS transistors, respectively.

13. A CMOS circuit for fast propagation of a digital signal from an input terminal to an output terminal, comprising:

a first data path having a first plurality of CMOS logic stages coupled between the input terminal of the CMOS circuit and an output terminal, said plurality of CMOS logic stages propagating a rising edge of the digital signal with a first delay and propagating a falling edge of the digital signal with a second delay, said first delay being substantially less than said second delay;

a second data path having a second plurality of CMOS logic stages coupled between the input terminal of the CMOS circuit and an output terminal, said second plurality of CMOS logic stages propagating a rising edge of the digital signal with a third delay and propagating a falling edge of the digital signal with a fourth delay, said fourth delay being substantially less than said third delay; and a combine circuit having a first input coupled to said output of said first data path and a second input coupled to said output of said second data path, and an output coupled to the output of the CMOS circuit, wherein, said combine circuit comprises:

a first pulse-generator having an input coupled to said output of said first data path, and an output;

a second pulse-generator having an input coupled to said output of said second data path, and an output;

a pull-up transistor coupled to said output of said first pulse-generator, said pull-up transistor coupling the output terminal of the CMOS circuit to a positive power supply voltage when turned on; and a pull-down transistor coupled to said output of said second pulse-generator, said pull-down transistor coupling the output terminal of the CMOS circuit to a negative power supply or ground when turned on.

14. The CMOS circuit of claim 13, further comprising a third data path having a third plurality of CMOS logic stages coupled between the input terminal of the CMOS circuit and the output terminal of the CMOS circuit, said third plurality of CMOS logic stages propagating rising and falling edges of the digital signal with substantially equal delays.

15. The CMOS circuit of claim 14 wherein each of said first and second pulse-generators comprises:

an odd number of serially coupled inverters with an input coupled to an output of the respective data path, and an output; and a NAND gate having a first input coupled to said output of the respective data path and said output of the serially coupled inverters.

16. The CMOS circuit of claim 14 wherein said pull-up transistor is a PMOS transistor having a gate terminal coupled to said output of said first pulse-generator, a source terminal coupled to said positive power supply and a drain terminal coupled to the output terminal of the CMOS circuit, and wherein said pull-down transistor is an NMOS transistor having a gate terminal coupled to said output of said second pulse-generator, a source terminal coupled to said negative power supply or ground, and a drain terminal coupled to the output terminal of the CMOS circuit.

17. The CMOS circuit of claim 13 wherein said first plurality of CMOS logic stages comprises a plurality of inverters with PMOS and NMOS transistors having channel sizes ratioed to obtain fast signal transition for the rising edge of the digital signal and slow signal transition for the falling edge.

18. The CMOS circuit of claim 17 wherein said second plurality of CMOS logic stages comprises a plurality of inverters with PMOS and NMOS transistors having channel sizes ratioed to obtain fast signal transition for the falling edge of the digital signal and slow signal transition for the rising edge.

* * * * *